(12) United States Patent
Umada et al.

(10) Patent No.: US 11,781,196 B2
(45) Date of Patent: Oct. 10, 2023

(54) GRAIN-ORIENTED ELECTROMAGNETIC STEEL SHEET AND METHOD OF PRODUCING GRAIN-ORIENTED ELECTROMAGNETIC STEEL SHEET

(71) Applicant: JFE Steel Corporation, Tokyo (JP)

(72) Inventors: Takumi Umada, Tokyo (JP); Shigehiro Takajo, Tokyo (JP); Takashi Terashima, Tokyo (JP)

(73) Assignee: JFE Steel Corporation, Tokyo (JP)

( * ) Notice: Subject to any disclaimer, the term of this patent is extended or adjusted under 35 U.S.C. 154(b) by 587 days.

(21) Appl. No.: 16/462,601

(22) PCT Filed: Nov. 20, 2017

(86) PCT No.: PCT/JP2017/041671
§ 371 (c)(1),
(2) Date: May 21, 2019

(87) PCT Pub. No.: WO2018/097100
PCT Pub. Date: May 31, 2018

(65) Prior Publication Data
US 2020/0063268 A1 Feb. 27, 2020

(30) Foreign Application Priority Data

Nov. 28, 2016 (JP) .................................. 2016-229757

(51) Int. Cl.
*C23C 14/06* (2006.01)
*C21D 9/46* (2006.01)
(Continued)

(52) U.S. Cl.
CPC ................. *C21D 9/46* (2013.01); *C21D 8/12* (2013.01); *C21D 8/1288* (2013.01);
(Continued)

(58) Field of Classification Search
None
See application file for complete search history.

(56) References Cited

U.S. PATENT DOCUMENTS

| 4,909,864 A | * | 3/1990 | Inokuti | ............... C21D 8/1294 148/111 |
| 2008/0190520 A1 | * | 8/2008 | Watanabe | ............... C23C 22/74 148/320 |

(Continued)

FOREIGN PATENT DOCUMENTS

| CN | 1890390 A | 1/2007 |
| EP | 0260927 A2 | 3/1988 |

(Continued)

OTHER PUBLICATIONS

Machine translation of JP 2005/240157 A, obtained from EspaceNet. (Year: 2021).*

(Continued)

*Primary Examiner* — Shamim Ahmed
*Assistant Examiner* — Bradford M Gates
(74) *Attorney, Agent, or Firm* — DLA Piper LLP (US)

(57) ABSTRACT

A grain-oriented electromagnetic steel sheet exhibits excellent magnetic characteristics and excellent coating film adhesion after strain relieving annealing. The grain-oriented electromagnetic steel sheet includes: a steel sheet; a coating film layer A that is a ceramic coating film which is formed on the steel sheet and has an oxide content of less than 30% by mass; and a coating film layer B that is an insulating tension coating film which is arranged on the coating film layer A and contains an oxide. The binding energy of the 1s orbital of oxygen in the coating film layer B is higher than 530 eV; and tension applied to the steel sheet by the coating film layer B per a thickness of 1.0 μm of the coating film layer B is 4.0 MPa/μm or more.

18 Claims, 2 Drawing Sheets

(51) Int. Cl.

| | | |
|---|---|---|
| *C23C 16/34* | (2006.01) | |
| *C23C 22/06* | (2006.01) | |
| *C23C 28/04* | (2006.01) | |
| *H01F 1/18* | (2006.01) | |
| *C23C 22/00* | (2006.01) | |
| *C21D 8/12* | (2006.01) | |

(52) U.S. Cl.
CPC ...... *C23C 14/0641* (2013.01); *C23C 14/0664* (2013.01); *C23C 14/0676* (2013.01); *C23C 16/34* (2013.01); *C23C 22/00* (2013.01); *C23C 22/06* (2013.01); *C23C 28/04* (2013.01); *H01F 1/18* (2013.01)

(56) References Cited

U.S. PATENT DOCUMENTS

| | | | |
|---|---|---|---|
| 2011/0039114 A1* | 2/2011 | Takahashi | C23C 22/22 427/318 |
| 2011/0067786 A1* | 3/2011 | Takashima | C22C 38/02 106/286.6 |
| 2013/0251984 A1 | 9/2013 | Schepers et al. | |

FOREIGN PATENT DOCUMENTS

| | | |
|---|---|---|
| EP | 1698706 A1 | 9/2006 |
| EP | 2799594 A1 | 11/2014 |
| JP | 64-68425 A | 3/1989 |
| JP | 64-79381 A | 3/1989 |
| JP | H01-147074 A | 6/1989 |
| JP | 01-176034 A | 7/1989 |
| JP | 7-278830 A | 10/1995 |
| JP | 2003129196 A * | 5/2003 |
| JP | 2005-240157 A | 9/2005 |

OTHER PUBLICATIONS

Machine Translation of JP 2003-129196 A (Year: 2003).*
P. Panjan et al, "Oxidation of TiN, ZrN, TinN, CrN, TiCrN and TiN/CrN multilayer hard coatings reactively sputtered at low temperature," Thin Solid Films, vol. 281-282, Aug. 1, 1996, pp. 298-301
Office Action dated Jul. 27, 2020, of counterpart Chinese Application No. 201780072874.X, along with a Search Report in English.
Extended European Search Report dated Jul. 24, 2019, of counterpart European Application No. 17874944.6
Office Action dated Jul. 18, 2023, of counterpart Chinese Application No. 201780072874.X, along with a Concise Statement of Relevance Office Action in English.

* cited by examiner

GRAIN-ORIENTED ELECTROMAGNETIC STEEL SHEET AND METHOD OF PRODUCING GRAIN-ORIENTED ELECTROMAGNETIC STEEL SHEET

TECHNICAL FIELD

This disclosure relates to a grain oriented electrical steel sheet and a method of producing a grain oriented electrical steel sheet.

BACKGROUND

Grain oriented electrical steel sheets are soft magnetic materials used as materials for iron cores of transformers, generators or the like. Grain oriented electrical steel sheets are characterized in having a crystal structure in which the <001> orientation that is an easy magnetization axis of iron is highly-precisely aligned in the rolling direction of the steel sheet. The texture as above is formed through finishing annealing of a manufacturing process of a grain oriented electrical steel sheet, which finishing annealing allows crystal grains with the {110}<001> orientation referred to as the so-called Goss orientation to preferentially grow to an enormous size. Grain oriented electrical steel sheets as products are required to have the magnetic property of high magnetic flux density and low iron loss.

The magnetic property of a grain oriented electrical steel sheet is improved by applying a tensile stress (tension) to a steel sheet surface. As one conventionally known technique of applying a tensile stress to a steel sheet, a technique in which a forsterite coating of about 2 µm thickness is formed on a steel sheet surface and another coating of about 2 µm thickness primarily composed of silicon phosphate is formed on the forsterite coating is typically used.

More specifically, the silicon phosphate coating having a lower thermal expansion coefficient than that of the steel sheet is formed at high temperature and cooled to room temperature, whereby a tensile stress is applied to the steel sheet using a difference in thermal expansion coefficient between the steel sheet and the silicon phosphate coating.

This silicon phosphate coating also acts as an insulating coating that is indispensable for a grain oriented electrical steel sheet. Owing to the insulation, a local eddy current is prevented from being generated in the steel sheet.

A surface of the grain oriented electrical steel sheet having undergone finishing annealing is smoothed by chemical polishing or electrolytic polishing, and then a tensile stress is applied by the coating above the steel sheet, whereby iron loss can remarkably be decreased.

Meanwhile, the forsterite coating between the steel sheet and the silicon phosphate coating forms, together with the steel sheet, a diffusion layer. Therefore, the smoothness of the steel sheet surface inevitably deteriorates. Adhesion between silicon phosphate and metal is so low that a silicon phosphate coating cannot be formed directly on a mirror-finished surface of a steel sheet. Thus, in the coating structure of a conventional grain oriented electrical steel sheet (steel sheet/forsterite coating/silicon phosphate coating), a surface of a steel sheet cannot be smoothed.

In JP 01-176034 A, to maintain the smoothness of a steel sheet surface and also apply a large tensile stress to the steel sheet, a ceramic coating made of TiN for instance is formed on the steel sheet by a CVD method or a PVD method. At this time, since a tensile stress applied to the steel sheet is proportional to the thickness of the ceramic coating, the ceramic coating is formed to have a thickness of at least 1 µm.

CVD methods and PVD methods, however, cause high manufacturing costs and, accordingly, coatings are desired to have a small thickness to the utmost extent, which in turn results in a decrease in tensile stress applied to a steel sheet.

In JP 64-068425 A, to compensate for a decrease in tension due to such a small coating thickness or to apply a much higher tension to a steel sheet, an insulation tension coating made of silicon phosphate is formed on a ceramic coating with a thickness of 1 µm or less.

We thus studied grain oriented electrical steel sheets in which an insulation tension coating was formed on a ceramic coating. We found that when the grain oriented electrical steel sheet is subjected to stress relief annealing, this sometimes causes the ceramic coating to peel off from the associated steel sheet or results in a poor magnetic property of the grain oriented electrical steel sheet.

There is thus a need to provide a grain oriented electrical steel sheet having excellent coating adhesion property and magnetic property after stress relief annealing, as well as a producing method thereof.

SUMMARY

We also found that, when a ceramic coating and an insulation tension coating are formed to have specific structures, the coating adhesion property and the magnetic property are both excellent even after stress relief annealing.

We thus provide [1] to [9]:

[1] A grain oriented electrical steel sheet, comprising:
 a steel sheet;
 a coating layer A that is a ceramic coating containing an oxide in an amount of less than 30 mass % and disposed on the steel sheet; and
 a coating layer B that is an insulation tension coating containing an oxide and disposed on the coating layer A,
 wherein a binding energy of is orbital of oxygen in the coating layer B is greater than 530 eV, and
 wherein a tension applied by the coating layer B to the steel sheet per 1.0 µm thickness of the coating layer B is not less than 4.0 MPa/µm.

[2] The grain oriented electrical steel sheet according to [1] above,
 wherein the coating layer A has a thickness of not less than 0.01 µm.

[3] The grain oriented electrical steel sheet according to [1] or [2] above,
 wherein the coating layer A has a thickness of not more than 0.30 µm.

[4] The grain oriented electrical steel sheet according to any one of [1] to [3] above,
 wherein the coating layer B has a thickness of not less than 1.0 µm.

[5] The grain oriented electrical steel sheet according to any one of [1] to [4] above,
 wherein the coating layer B has a thickness of not more than 10.0 µm.

[6] The grain oriented electrical steel sheet according to any one of [1] to [5] above,
 wherein, in the coating layer B,
 $P_2O_5$ is contained in an amount of 25 to 55 mass %,
 $SiO_2$ is contained in an amount of 42 to 58 mass %, and an oxide of an atom having an electronegativity higher than 1.5 other than P and Si is contained in an amount of 2 to 18 mass %.

[7] The grain oriented electrical steel sheet according to any one of [1] to [6] above, wherein the coating layer A contains a nitride or a carbonitride.

[8] A grain oriented electrical steel sheet producing method of producing the grain oriented electrical steel sheet according to any one of [1] to [7] above, wherein the coating layer A is formed by a chemical vapor deposition method or a physical vapor deposition method.

[9] The grain oriented electrical steel sheet producing method according to [8] above, wherein the coating layer B is formed by applying a coating chemical solution on the coating layer A with an application roll, followed by baking in a nitrogen atmosphere.

We can provide a grain oriented electrical steel sheet having excellent coating adhesion property and magnetic property after stress relief annealing, as well as a producing method thereof.

REFERENCE SIGNS LIST

Figure 1:
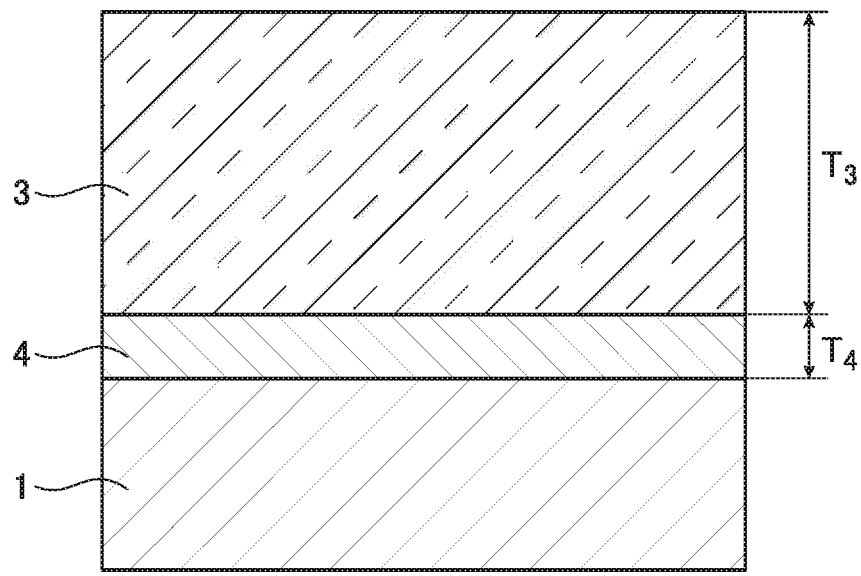
FIG. 1 is a cross-sectional view schematically showing a preferred example of a grain oriented electrical steel sheet.

1: steel sheet
2: forsterite coating
3: insulation tension coating
4: ceramic coating
$T_2$: forsterite coating thickness
$T_3$: insulation tension coating thickness
$T_4$: ceramic coating thickness

DETAILED DESCRIPTION

A ceramic coating with a thickness of not more than 1.00 μm was formed on a steel sheet, and an insulation tension coating made of silicon phosphate was formed thereon. When the resulting steel sheet was subjected to stress relief annealing, the ceramic coating peeled off from the steel sheet (i.e., the coating adhesion property deteriorated) in some cases. We conducted many experiments to determine why this occurred and discovered the following.

The use of silicon phosphate having a low thermal expansion coefficient as a material for the insulation tension coating is effective in increasing tensile stress applied by the insulation tension coating to the associated steel sheet and thereby improving the magnetic property, while components in the insulation tension coating oxidize the ceramic coating under a high temperature environment, thus generating reaction products.

Subsequently, the reaction products diffuse in the ceramic coating from the interface between the insulation tension coating and the ceramic coating toward the steel sheet during stress relief annealing at 800° C. for 3 hours. When the reaction products further diffuse and reach the interface between the ceramic coating and the steel sheet, they react with Fe of the steel sheet and form precipitates.

Then, during a cooling process in stress relief annealing, i.e., when stress starts to be applied to the interface between the steel sheet and the ceramic coating due to a difference in thermal expansion coefficient, the precipitates cannot fully receive the stress and consequently peel off from the steel sheet. Thus, the ceramic coating peels off from the steel sheet. In other words, the coating adhesion property deteriorates.

We thus considered adjusting a component (oxide) in the insulation tension coating to suppress the oxidation reaction of the ceramic coating caused by the insulation tension coating.

The reactivity of an oxide is correlated with the binding energy of 1s orbital of oxygen (O) measured by the XPS method. More specifically, as the binding energy of oxygen 1s is higher, this means that oxygen is bonded to the adjacent element with a stronger covalent bonding so that the oxidation reaction hardly occurs.

First, we formed, after finishing annealing, a ceramic coating made of a nitride and other components and having a thickness of not larger than 1.00 μm on a steel sheet from whose surface a forsterite coating had been removed by pickling. Thereafter, a coating chemical solution was applied on the ceramic coating with an application roll and baked in a nitrogen atmosphere, thereby forming an insulation tension coating with the binding energy of is orbital of oxygen being greater than 530 eV. Then, stress relief annealing was carried out at 800° C. for 3 hours in a nitrogen atmosphere.

As the ceramic coating is thicker, the phenomenon that the reaction products diffuse in the ceramic coating from the interface between the insulation tension coating and the ceramic coating toward the steel sheet, and when the reaction products further diffuse and reach the interface between the ceramic coating and the steel sheet, they react with Fe of the steel sheet and form precipitates can be prevented more effectively. Thus, since the ceramic coating is thinner, it becomes difficult to ensure the coating adhesion property.

We found, however, that when the foregoing example is employed, even though the ceramic coating has a thickness of not larger than 0.30 μm which is extremely thin, an excellent coating adhesion property can be maintained even after stress relief annealing.

Figure 2:
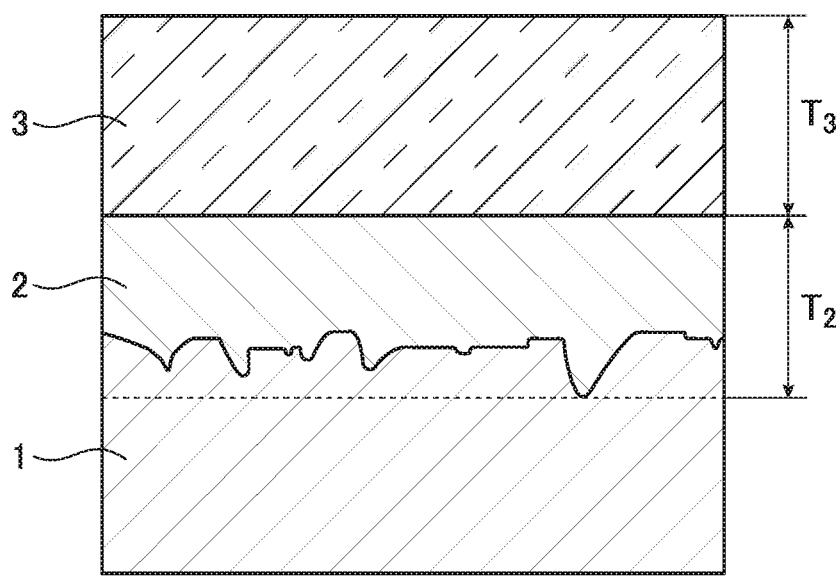
FIG. 2 is a cross-sectional view schematically showing a conventional grain oriented electrical steel sheet.

FIG. 1 is a cross-sectional view schematically showing a preferred example of our grain oriented electrical steel sheet. FIG. 2 is a cross-sectional view schematically showing a conventional grain oriented electrical steel sheet.

First, as shown in FIG. 2, the conventional grain oriented electrical steel sheet is typically configured such that a forsterite coating 2 is disposed on a steel sheet 1 and an insulation tension coating 3 is formed on the forsterite coating. In FIG. 2, the thickness $T_2$ of the forsterite coating 2 is about 2 μm, and the thickness $T_3$ of the insulation tension coating 3 is about 2 μm.

On the other hand, in FIG. 1, the forsterite coating 2 in the conventional sheet (see FIG. 2) is replaced by a ceramic coating 4. More specifically, the ceramic coating 4 is formed by a CVD method or a PVD method on a surface of the steel sheet 1 having been smoothed by a method such as chemical polishing or electrolytic polishing. Since, in FIG. 1, the thickness T4 of the ceramic coating 4 is not more than 1.00 μm for instance, even if the thickness $T_3$ of the insulation tension coating 3 is increased to 2 μm or more, the effective steel sheet volume (lamination factor) of the grain oriented electrical steel sheet when used as a transformer is not decreased.

Since tension applied by a coating to a steel sheet is usually proportional to the thickness of the coating, increasing the thickness of the insulation tension coating should be effective at improving the magnetic property.

We found that, by adjusting the rotational speed of an application roll, the specific gravity of a coating chemical solution, or another factor to thereby increase the thickness of the resulting insulation tension coating, tension applied to the associated steel sheet is increased and, thus, the resulting grain oriented electrical steel sheet can have an improved magnetic property.

Grain Oriented Electrical Steel Sheet and Producing Method Thereof

Our grain oriented electrical steel sheet of is described below.

Our grain oriented electrical steel sheet is a grain oriented electrical steel sheet comprising a steel sheet, a coating layer A that is a ceramic coating containing an oxide in an amount of less than 30 mass % and disposed on the steel sheet, and a coating layer B that is an insulation tension coating containing an oxide and disposed on the coating layer A, wherein a binding energy of is orbital of oxygen in the coating layer B is greater than 530 eV, and tension applied by the coating layer B to the steel sheet per 1.0 μm thickness of the coating layer B is not less than 4.0 MPa/μm.

Our grain oriented electrical steel sheet is excellent in the coating adhesion property after stress relief annealing (hereinafter also called "coating adhesion property") as well as in the magnetic property after stress relief annealing (hereinafter also called "magnetic property").

The grain oriented electrical steel sheet is described below in further detail. The following description also covers the method of producing our grain oriented electrical steel sheet.

Steel Sheet

The type of a steel sheet is not particularly limited, and a steel sheet described below is one example.

As the ingot that forms a steel sheet, an ingot containing, as components in steel, in percentage by mass, C in an amount from 0.002% to 0.10%, Si in an amount from 2.5% to 4.0% and Mn in an amount from 0.005% to 0.50% and also containing Al in an amount from 0.010% to 0.050% and N in an amount from 0.003% to 0.020% or Al in an amount from 0.010% to 0.050%, N in an amount from 0.003% to 0.020%, Se in an amount from 0.003% to 0.030% and/or S in an amount from 0.002% to 0.03%, with the balance being inevitable impurities and Fe is preferably used for the sake of the magnetic property. However, the ingot for use is not limited thereto.

Such an ingot is subjected to hot rolling and then several times of cold rolling with several times of annealing performed therebetween, to thereby obtain a final cold rolled steel sheet, which is in turn subjected to decarburization annealing and finishing annealing to allow secondary recrystallized grains having the Goss orientation to develop. Thus, a steel sheet is obtained. In this process, the number of times of cold rolling is preferably up to two times to achieve a balance between the magnetic property and the cost.

Of the foregoing components in steel, C is removed through decarburization annealing, and Al, N, Se and S are purified through finishing annealing so that these components are to be contained in the steel sheet having undergone finishing annealing in small amounts equivalent to the amount of inevitable impurities.

Thereafter, a forsterite coating on a steel sheet surface is removed by pickling or another method.

Thus, it is preferred from the manufacturing aspect that, as conventionally carried out, a forsterite coating be formed on a steel sheet surface and thereafter removed by pickling. Although formation of a forsterite coating is favorable for decarburization of a steel sheet, when another decarburization method is employed, a forsterite coating need not be formed.

After the forsterite coating is removed from the steel sheet surface, the steel sheet surface is smoothed by a method such as chemical polishing or electrolytic polishing.

Usually, as a steel sheet surface condition is rougher, the coating adhesion property improves owing to the anchoring effect. In contrast, as a steel sheet surface condition is smoother, a magnetic domain moves more easily, and the amount of improvement in the magnetic property when a tension stress is applied increases, accordingly.

Even when use is made of our steel sheet having undergone chemical polishing that can smooth a steel sheet surface the most, the coating layer A (ceramic coating) does not peel off after stress relief annealing and, thus, an excellent coating adhesion property is maintained. Therefore, it is preferable to smooth a steel sheet surface to the extent possible by chemical polishing or electrolytic polishing to achieve an arithmetic mean roughness Ra of not more than 0.4 μm.

Coating Layer A: Ceramic Coating

Our grain oriented electrical steel sheet has the coating layer A that is a ceramic coating disposed on a surface of the steel sheet as above.

Composition

Oxide

The amount of oxide in the coating layer A (ceramic coating) is less than 30 mass %, preferably not more than 15 mass %, more preferably not more than 5 mass % and even more preferably not more than 2 mass % because, when the lattice of the ceramic coating matches the body-centered cubic lattice of the steel sheet, a more excellent coating adhesion property can be achieved.

The amount of oxide in the ceramic coating can be measured with X-ray fluorescence using a standard sheet having a known composition.

Exemplary elements in the oxide other than oxygen (O) include those listed as elements in a non-oxide other than C and N, which is described below.

Non-Oxide

A component (component other than the oxide) contained in the coating layer A (ceramic coating) is at least one selected from the group consisting of a carbide, a nitride and a carbonitride, for example.

When the ceramic coating contains a nitride or a carbonitride, the coating adhesion property is further improved.

When the non-oxide is at least one selected from the group consisting of a carbide, a nitride and a carbonitride, an exemplary element in the non-oxide other than C and N is at least one selected from the group consisting of Cr, Ti, Al, Si, Zr, Mo, Y, Nb, W, Fe, Mn, Ta, Ge and Hf, and of these, at least one selected from the group consisting of Cr, Ti, Al, Si, Zr, Mo, Y, Nb and W is preferred.

For the non-oxide, a nitride or a carbonitride having a rock salt structure is preferred for the reason that this easily matches the body-centered cubic lattice of the steel sheet.

The non-oxide is preferably a component contributing to improvement in oxidation resistance of the ceramic coating. According to the Arrhenius plot formulated by P. Panjan et al., Thin Solid Films, 281-282, (1996), 298, addition of Ti or the like to a Cr-containing nitride can bring about increased oxidation resistance. Accordingly, a non-oxide containing three or more elements such as TiCrN or AlCrN can also be favorably used.

The amount of non-oxide in the ceramic coating is preferably not less than 70 mass %. It is preferable that the ceramic coating be substantially made of the non-oxide.

A value obtained by subtracting the amount of oxide from the total mass of the ceramic coating can be regarded as the amount of non-oxide in the ceramic coating.

Thickness

The thickness of the coating layer A (ceramic coating) is preferably not more than 1.00 μm and more preferably not more than 0.30 μm for the sake of suppressing an increase in cost.

On the other hand, the thickness of the ceramic coating is preferably not less than 0.01 μm because the coating adhesion property becomes more excellent.

Coating Formation Method

The method of forming the coating layer A (ceramic coating) is preferably a CVD (Chemical Vapor Deposition) method or a PVD (Physical Vapor Deposition) method.

A preferred CVD method is a thermal CVD method. The coating formation temperature is preferably from 900° C. to 1100° C. While the coating can be formed in the atmospheric pressure, it is preferable to reduce pressure for uniform coating formation and, thus, the pressure during coating formation is more preferably 10 to 1000 Pa for manufacturing reasons.

A preferred PVD method is an ion plating method. The coating formation temperature is preferably from 300° C. to 600° C. for manufacturing reasons. The pressure during coating formation is preferably reduced and more preferably 0.1 to 100 Pa. During coating formation, a bias voltage of −10 to −100 V is preferably applied with the steel sheet serving as the cathode. Plasma is preferably used for ionization of a raw material because this results in a higher coating formation rate.

When a ceramic coating containing three or more elements such as TiAlN or TiCrN is formed, a preferred coating formation method is any PVD method, with the ion plating method being more preferred. When a CVD method utilizing a thermodynamic reaction for coating formation is used, it is sometimes difficult to obtain a desired composition. Since a PVD method ionizes an alloy material and allows the material to coherently precipitate, a desired composition can easily be obtained.

Coating Layer B: Insulation Tension Coating

Our grain oriented electrical steel sheet has the coating layer B that is an insulation tension coating containing an oxide and disposed on the coating layer A (ceramic coating).

Binding Energy of 1s Orbital of Oxygen

The binding energy of is orbital of oxygen in the coating layer B (insulation tension coating) is greater than 530 eV. With this configuration, an oxidation reaction of the ceramic coating with the insulation tension coating can be suppressed as described above and, thus, the grain oriented electrical steel sheet can have an excellent coating adhesion property.

The binding energy above is preferably not less than 532 eV, more preferably not less than 533 eV and even more preferably not less than 536 eV because the coating adhesion property becomes more excellent.

The upper limit of the binding energy is not particularly limited and is, for example, not more than 545 eV.

Figure 4:
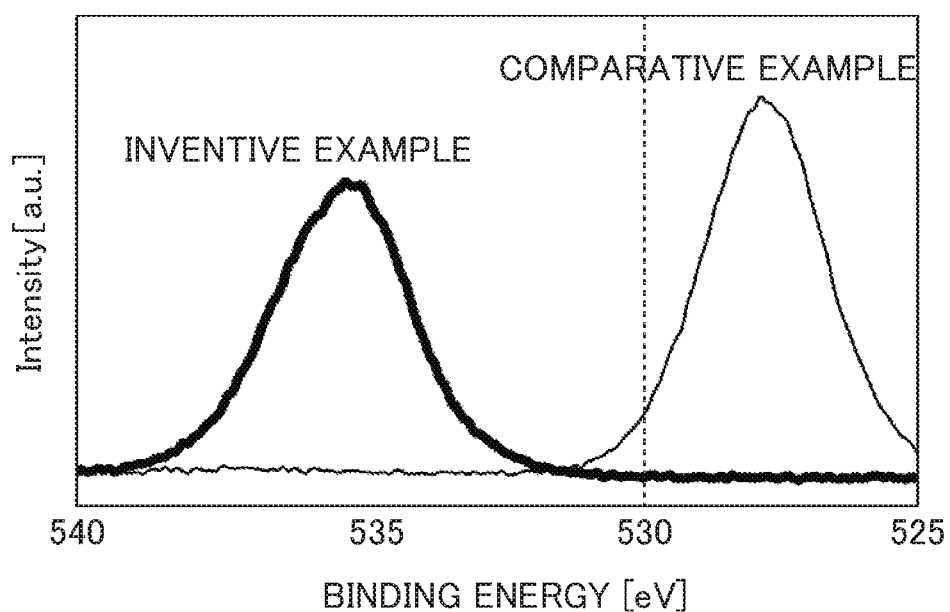
FIG. 4 is a graph showing the binding energy of is orbital of oxygen as measured by an XPS method.

The expression "the binding energy of 1s orbital of oxygen is greater than 530 eV" means that "the binding energy of 1s orbital of oxygen (O) determined by X-ray photoelectron spectroscopy (XPS) has its peak within a range greater than 530 eV" as shown in FIG. 4.

Composition

The coating layer B (insulation tension coating) contains an oxide.

To increase the binding energy of 1s orbital of oxygen in the insulation tension coating and reduce the oxidizing ability of the insulation tension coating, it is preferable to increase the proportion of atoms bonded to oxygen (O) with strong covalent bonding in the insulation tension coating. In other words, it is preferable to add an atom with a high electronegativity.

For instance, since the electronegativities of silicon (Si) and phosphorus (P) are about 2 and thus high, when the proportion of those atoms is increased, the binding energy of 1s orbital of oxygen in the insulation tension coating increases.

Phosphorus (P) is preferably contained to have the binding energy of 1s orbital of oxygen in the insulation tension coating being greater than 530 eV.

An oxide of phosphorus (phosphate), however, has a relatively large coefficient of thermal expansion. Therefore, when the insulation tension coating contains a too much amount of an oxide of phosphorus (phosphate), this may be disadvantageous in terms of a tension applied to the steel sheet.

In the meantime, when the insulation tension coating contains an oxide of silicon (silica) in a larger amount, while the tension improves, since an oxide of silicon (silica) has a weaker effect in increasing the binding energy of 1s orbital of oxygen compared to phosphorus, it may be difficult to achieve both improved tension and reduced oxidizing ability.

Therefore, it is preferable to contain an oxide of an atom having an electronegativity higher than 1.5 other than P and Si. As an ionized atom has a larger valence, the atom can be covalently bonded to more oxygen atoms so that the coating adhesion property can be improved even with a small amount of the atom and, in addition, the filling density of the insulation tension coating increases and the Young's modulus increases, resulting in an increase in tension applied to the steel sheet.

Preferred specific examples of atoms having an electronegativity higher than 1.5 (excluding P and Si) include Ti, Mn, Ni, Nb, V and W.

In view of the foregoing, the amount of oxide of phosphorus ($P_2O_5$) in the insulation tension coating is preferably from 25 to 55 mass % and more preferably from 35 to 45 mass % because the coating adhesion property and the magnetic property become more excellent.

The amount of oxide of silicon ($SiO_2$) in the insulation tension coating is preferably 42 to 58 mass % and more preferably 48 to 58 mass %.

The amount of oxide of an atom having an electronegativity higher than 1.5 (excluding P and Si) (e.g., $TiO_2$, $MnO_2$, $NiO_2$, $Nb_2O_5$, $V_2O_5$, $WO_3$) in the insulation tension coating is preferably 2 to 18 mass % and more preferably 2 to 12 mass %.

Meanwhile, when the insulation tension coating contains an atom having a low electronegativity (e.g., Na or K), the binding energy of is orbital of oxygen is decreased whereby the oxidizing ability of the insulation tension coating tends to increase. Thus, this may be unfavorable.

The amount of the foregoing oxide in the insulation tension coating can be measured by X-ray fluorescence spectrometry using a standard sheet for a known composition included in an insulation tension coating.

The oxides as above in the insulation tension coating are sometimes collectively called "silicon phosphate."

Tension

Tension applied by the coating layer B (insulation tension coating) to the steel sheet per 1.0 μm thickness of the coating layer B (insulation tension coating) is not less than 4.0 MPa/μm. With this configuration, the grain oriented electrical steel sheet can have an excellent magnetic property.

The upper limit of the tension is not particularly limited and is, for example, not more than 10.0 MPa.

The evaluation method (measurement method) of the tension above is as follows:

First, the ceramic coating and the insulation tension coating are formed in this order on each side of the steel sheet (having no forsterite coating), thus preparing a specimen (rolling direction, 280 mm; direction perpendicular to rolling direction, 30 mm) with no deflection. A corrosion protection tape is attached over the entire surface of one side of the prepared specimen. Subsequently, the specimen having the corrosion protection tape attached thereon is immersed in an aqueous sodium hydroxide solution at about 110° C. for about 10 minutes. Through this process, the insulation tension coating on the side having no corrosion protection tape thereon is removed. Since the steel sheet does not have the insulation tension coating on one side, a curvature (deflection) of the steel sheet occurs in the sheet thickness direction-rolling direction plane. The corrosion protection tape is removed, and the radius of curvature R of the steel sheet is determined. The tension σ of the insulation tension coating is provided as the formula "σ=Ed/3R," where E is the Young's modulus of the steel sheet in the rolling direction, and d is the thickness of the coating on one side.

Then, the obtained value of tension σ is divided by the thickness of the insulation tension coating to determine the tension described above (unit: MPa/μm).

Thickness

Figure 3:
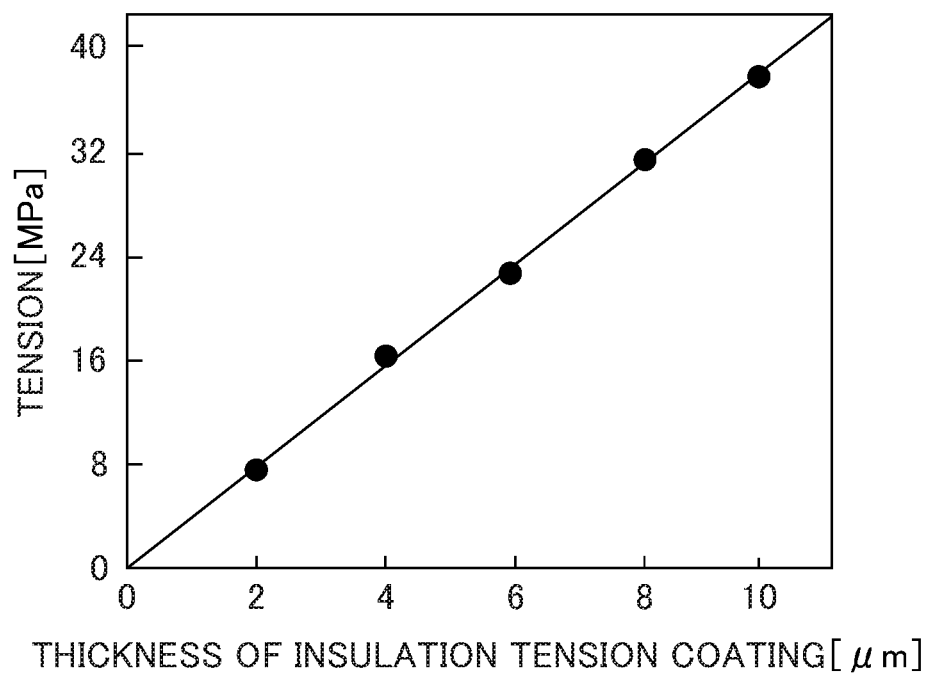
FIG. 3 is a graph showing the relationship between the thickness of an insulation tension coating made of silicon phosphate and the tension that the insulation tension coating with that thickness applies to the associated steel sheet.

FIG. 3 is a graph showing the relationship between the thickness of an insulation tension coating and the tension that the insulation tension coating with that thickness applies to the associated steel sheet. As shown in FIG. 3, with increasing thickness of the insulation tension coating, tension (tension stress) applied to the steel sheet increases, and this is probably the reason of an excellent magnetic property (lower iron loss) of the grain oriented electrical steel sheet.

The thickness of the insulation tension coating is preferably not less than 1.0 μm because the grain oriented electrical steel sheet can have a more excellent magnetic property.

When the insulation tension coating is too thick, however, this causes a decrease in effective steel sheet volume of the grain oriented electrical steel sheet when used as a transformer, and also an iron loss reducing effect exerted by the tension stress is saturated so that transformer properties may rather deteriorate. Thus, the upper limit of the thickness of the insulation tension coating is preferably not more than 10.0 μm.

Coating Formation Method

The method of forming the insulation tension coating is not particularly limited, and preferred examples thereof include a method involving applying a coating chemical solution onto the ceramic coating, followed by optionally drying, and then baking in a nitrogen atmosphere. This method is taken as an example and described below.

Coating Chemical Solution

The coating chemical solution preferably contains phosphoric acid and/or phosphate, and colloidal silica. Exemplary metal types of the phosphate include Mn and Ni.

The coating chemical solution may further contain an M compound in addition to phosphoric acid and/or phosphate and colloidal silica. In the above, M is for instance an element (atom) having an electronegativity higher than 1.5, and examples thereof include Ti, Mn, Ni, Nb, V and W.

Examples of the Ti compound include $TiO_2$ and $Ti_2O_3$.

Examples of the Mn compound include $Mn(NO_3)_2$, $MnSO_4$ and $MnCO_3$.

Examples of the Ni compound include $Ni(NO_3)_2$ and $NiSO_4$.

Examples of the Nb compound include $Nb_2O_5$.

Examples of the V compound include $NH_4VO_3$ and $V_2O_5$.

Examples of the W compound include $K_2WO_4$ and $WO_3$.

The amounts of respective components in the coating chemical solution are not particularly limited and are suitably adjusted to allow the resulting insulation tension coating to have the composition as described above.

For instance, the amount of phosphoric acid and/or phosphate in the coating chemical solution is preferably not less than 20 mol % with respect to the total solids of the coating chemical solution. However, the amount is not limited thereto.

Coating Formation Condition

The method of applying the coating chemical solution as above onto the coating layer A (ceramic coating) is not particularly limited and preferably utilizes an application roll for manufacturing cost reasons.

The baking temperature and the baking time are preferably 700° C. to 900° C. and 10 to 30 seconds, respectively, for the following reasons.

With a baking temperature of up to 900° C. and/or a baking time of up to 30 seconds, a reaction upon which precipitates are formed and cause a poor coating adhesion property between the ceramic coating and the insulation tension coating can be further suppressed, resulting in a further excellent coating adhesion property.

The coating chemical solution is dried in the first stage of formation of the insulation tension coating. With a baking temperature of not lower than 700° C. and/or a baking time of not less than 10 seconds, drying of the coating chemical solution sufficiently proceeds so that moisture included in the coating chemical solution can adequately be removed, thus further improving tension stress applied by the insulation tension coating to the steel sheet. In addition, oxidization of the ceramic coating caused by moisture can be suppressed during stress relief annealing.

The baking atmosphere is preferably a nitrogen atmosphere.

When the baking atmosphere is an air atmosphere, the ceramic coating is easily oxidized due to the presence of, for example, moisture and/or oxygen contained in the air. However, in a nitrogen atmosphere, oxidization of the ceramic coating is suppressed, resulting in a further excellent coating adhesion property.

Stress Relief Annealing

The grain oriented electrical steel sheet may sometimes be subjected to stress relief annealing. The conditions for stress relief annealing are not particularly limited and, for instance, annealing is carried out in a nitrogen or another atmosphere at a temperature of 700° C. to 900° C. for 2 to 4 hours.

Groove Formation

To further improve the magnetic property of the grain oriented electrical steel sheet, use may be made of the technique of refining magnetic domains of the grain oriented electrical steel sheet by forming a groove near a steel sheet surface such that the groove extends across the rolling direction of the grain oriented electrical steel sheet or by introducing a strain by laser irradiation or electron beam irradiation.

While a magnetic domain refining effect imparted by groove formation is maintained even after annealing, the degree of strain introduced by laser irradiation or electron beam irradiation is reduced through stress relief annealing so that a resulting grain oriented electrical steel sheet is sometimes improper for a wound core application.

The grain oriented electrical steel sheet is, however, excellent in the coating adhesion property and the magnetic property even when no stress relief annealing is carried out (for instance, when the grain oriented electrical steel sheet is dedicated to pile iron cores). Therefore, when no stress relief annealing is carried out, the magnetic property can be further improved by using the magnetic domain refining technique of introducing a strain.

EXAMPLES

Our steel sheets and methods will be specifically described below with reference to examples. However, this disclosure should not be construed as being limited to the following examples.

Test Example 1

Production of Grain Oriented Electrical Steel Sheet

A coating layer A (ceramic coating) and a coating layer B (insulation tension coating) were formed in this order on a steel sheet as described below, thereby obtaining a grain oriented electrical steel sheet.

Steel Sheet

Use was made of an ingot containing, as components in steel, in percentage by mass, C in an amount of 0.05%, Si in an amount of 3.2%, Mn in an amount of 0.05%, Al in an amount of 0.03%, N in an amount of 0.005% and Se in an amount of 0.01%, with the balance being inevitable impurities and Fe.

The ingot was subjected to hot rolling, hot band annealing, and two times of cold rolling with intermediate annealing performed therebetween, to thereby obtain a final cold rolled steel sheet with a thickness of 0.23 mm, which was in turn subjected to decarburization annealing and finishing annealing to allow secondary recrystallized grains having the Goss orientation to develop. Thus, a steel sheet having a forsterite coating was obtained.

Subsequently, of the steel sheet having a forsterite coating, the forsterite coating on a steel sheet surface was removed by pickling, whereafter the surface was smoothed by chemical polishing using hydrofluoric acid. Thus, a steel sheet was obtained. The thickness of the steel sheet after the chemical polishing was 0.22 mm.

Coating Layer A: Ceramic Coating

Next, a TiN ceramic coating with a thickness of 0.20 μm was formed on the steel sheet by a CVD method. The amount of oxide in the ceramic coating was not more than 2 mass % in each sample. For the CVD method, a thermal CVD method was used, and the coating formation was carried out under conditions of 1050° C. and 1000 Pa.

Coating Layer B: Insulation Tension Coating

Next, a coating chemical solution was applied using an application roll onto the ceramic coating formed on the steel sheet, dried, and then baked in a nitrogen atmosphere at 850° C. for 15 seconds. Thus, an insulation tension coating with a thickness of 2.0 μm was formed.

The coating chemical solution was prepared by selecting one or more from among phosphate, colloidal silica (AT-30 manufactured by ADEKA Corporation; average particle size, 10 nm) and an M compound and blending the selected component(s) such that the resulting insulation tension coating can have the composition as stated in Table 1 below.

For the M compound, the following compounds were used:
Li: LiOH
Na: NaOH
K: KOH
Mg: $Mg_2P_2O_7$ (the amount thereof was calculated as the total amount of MgO and $P_2O_5$)
Ca: $Ca_2P_2O_7$ (the amount thereof was calculated as the total amount of CaO and $P_2O_5$)
Sr: $Sr_2P_2O_7$ (the amount thereof was calculated as the total amount of SrO and $P_2O_5$)
Ba: $Ba_2P_2O_7$ (the amount thereof was calculated as the total amount of BaO and $P_2O_5$)
Y: $YPO_4$ (the amount thereof was calculated as the total amount of $Y_2O_3$ and $P_2O_5$)
Ti: $TiO_2$
Zr: $ZrO_2$
Mn: $Mn(NO_3)_2$ (the amount thereof was calculated as the amount of $MnO_2$)

Ni: $Ni(NO_3)_2$ (the amount thereof was calculated as the amount of $NiO_2$)

Nb: $Nb_2O_5$

V: $NH_4VO_3$ (the amount thereof was calculated as the amount of $V_2O_5$)

W: $WO_3$.

With regard to compositions shown in Table 1, when a composition is represented by "$40P_2O_5$-$55SiO_2$-$5WO_3$" for example, this means that the amount of $P_2O_5$ is "40 mass %," the amount of $SiO_2$ is "55 mass %," and the amount of $WO_3$ is "5 mass %."

The binding energy (unit: eV) of is orbital of oxygen in the insulation tension coating was determined by the XPS method. The results are shown in Table 1 below. The measurement by the XPS method was conducted using SSX-100 manufactured by Surface Science Instruments.

FIG. 4 is a graph showing the binding energy of is orbital of oxygen as measured by the XPS method. FIG. 4 shows a curve of one inventive example (No. 17 in Table 1 below) and a curve of one comparative example (No. 9 in Table 1 below) as typical examples. As shown in FIG. 4, the curve of the inventive example has its peak within a range greater than 530 eV, while the curve of the comparative example has its peak within a range less than 530 eV.

With each of the resulting grain oriented electrical steel sheets, the tension (unit: MPa/μm) applied by the insulation tension coating to the steel sheet per 1.0 μm thickness of the insulation tension coating was determined by the method described above. The results are shown in Table 1 below.

Evaluation

Each of the obtained grain oriented electrical steel sheets was subjected to stress relief annealing in a nitrogen atmosphere at 800° C. for 3 hours. Thereafter, the evaluation was made as follows.

Coating Adhesion Property

The grain oriented electrical steel sheet having undergone stress relief annealing was wound around round bars having diameters different on a 5-millimeter basis, i.e., diameters of 5 mm, 10 mm, . . . (but including a round bar having a diameter of 3 mm) to determine the minimum diameter (unit: mm) from among diameters with which the ceramic coating did not peel off. The results are shown in Table 1 below. As the minimum diameter of diameters with which the coating does not peel off (i.e., no peel-off diameter) is smaller, the coating adhesion property after stress relief annealing can be rated as more excellent, and a no peel-off diameter of less than 30 mm is favorable.

Iron Loss $W_{17/50}$

For the grain oriented electrical steel sheet having undergone stress relief annealing, the iron loss $W_{17/50}$ was measured. The results are shown in Table 1 below. For the samples where the iron loss $W_{17/50}$ was not measured, "-" was given in Table 1 below. When the iron loss $W_{17/50}$ (unit: W/kg) is less than 0.80, the magnetic property after stress relief annealing can be rated as excellent.

TABLE 1

| | | Coating layer B (Insulation tension coating) | | | Evaluation | | |
|---|---|---|---|---|---|---|---|
| No. | Composition [mass %] | Binding energy of 1 s orbital of oxygen [eV] | Tension per 1.0 μm thickness [MPa/μm] | Coating adhesion property [mmφ] | Iron loss $W_{17/50}$ [W/kg] | Remarks |
| 1 | $100P_2O_5$ | 543 | 0.5 | 5 | 0.86 | CE |
| 2 | $80P_2O_5$—$20SiO_2$ | 539 | 2.0 | 15 | 0.82 | CE |
| 3 | $60P_2O_5$—$40SiO_2$ | 536 | 2.5 | 20 | 0.81 | CE |
| 4 | $40P_2O_5$—$60SiO_2$ | 533 | 3.5 | 20 | 0.80 | CE |
| 5 | $20P_2O_5$—$80SiO_2$ | 528 | 4.0 | 50 | 0.71 | CE |
| 6 | $40P_2O_5$—$55SiO_2$—$5Li_2O$ | 527 | 3.0 | 50 | 0.90 | CE |
| 7 | $40P_2O_5$—$55SiO_2$—$5Na_2O$ | 524 | 3.0 | 55 | 0.92 | CE |
| 8 | $40P_2O_5$—$55SiO_2$—$5K_2O$ | 522 | — | Peeled off | 0.95 | CE |
| 9 | $40P_2O_5$—$55SiO_2$—$5MgO$ | 528 | 4.0 | 50 | 0.76 | CE |
| 10 | $40P_2O_5$—$55SiO_2$—$5CaO$ | 526 | 3.5 | 60 | 0.86 | CE |
| 11 | $40P_2O_5$—$55SiO_2$—$5SrO$ | 525 | — | Peeled off | 0.89 | CE |
| 12 | $40P_2O_5$—$55SiO_2$—$5BaO$ | 522 | — | Peeled off | 0.90 | CE |
| 13 | $40P_2O_5$—$55SiO_2$—$5Y_2O_3$ | 526 | 4.0 | 40 | 0.75 | CE |
| 14 | $40P_2O_5$—$55SiO_2$—$5TiO_2$ | 532 | 4.0 | 15 | 0.73 | IE |
| 15 | $40P_2O_5$—$55SiO_2$—$5ZrO_2$ | 527 | 3.5 | 45 | 0.81 | CE |
| 16 | $40P_2O_5$—$55SiO_2$—$5MnO_2$ | 533 | 4.0 | 10 | 0.74 | IE |
| 17 | $40P_2O_5$—$55SiO_2$—$5NiO_2$ | 535 | 4.0 | 10 | 0.73 | IE |
| 18 | $40P_2O_5$—$55SiO_2$—$5Nb_2O_5$ | 536 | 4.0 | 5 | 0.73 | IE |
| 19 | $40P_2O_5$—$55SiO_2$—$5V_2O_5$ | 537 | 4.5 | 5 | 0.71 | IE |
| 20 | $40P_2O_5$—$55SiO_2$—$5WO_3$ | 544 | 4.5 | 5 | 0.70 | IE |
| 21 | $40P_2O_5$—$58SiO_2$—$2NiO_2$ | 534 | 4.0 | 10 | 0.74 | IE |
| 22 | $37P_2O_5$—$45SiO_2$—$18WO_3$ | 547 | 4.7 | 10 | 0.69 | IE |
| 23 | $25P_2O_5$—$55SiO_2$—$20V_2O_5$ | 531 | 4.5 | 15 | 0.70 | IE |
| 24 | $55P_2O_5$—$35SiO_2$—$10V_2O_5$ | 538 | 4.0 | 10 | 0.73 | IE |
| 25 | $48P_2O_5$—$42SiO_2$—$10Nb_2O_5$ | 538 | 4.0 | 10 | 0.73 | IE |
| 26 | $32P_2O_5$—$58SiO_2$—$10Nb_2O_5$ | 532 | 4.5 | 5 | 0.71 | IE |

IE: Inventive Example
CE: Comparative Example

As can be seen in Table 1 above, with the grain oriented electrical steel sheets of the inventive examples in which the binding energy of 1s orbital of oxygen in the insulation tension coating is greater than 530 eV and the tension of the insulation tension coating is not less than 4.0 MPa/μm, the no peel-off diameter is as small as 5 to 15 mm, which means an excellent coating adhesion property, and the iron loss $W_{17/50}$ is less than 0.80, which means an excellent magnetic property.

Test Example 2

Production of Grain Oriented Electrical Steel Sheet

A coating layer A (ceramic coating) and a coating layer B (insulation tension coating) were formed in this order on a steel sheet as described below, thereby obtaining a grain oriented electrical steel sheet.

Steel Sheet

Use was made of an ingot containing, as components in steel, in percentage by mass, C in an amount of 0.05%, Si in an amount of 3.2%, Mn in an amount of 0.05%, Al in an amount of 0.03%, N in an amount of 0.005% and Se in an amount of 0.01%, with the balance being inevitable impurities and Fe.

The ingot was subjected to hot rolling, hot band annealing, and two times of cold rolling with intermediate annealing performed therebetween, to thereby obtain a final cold rolled steel sheet with a thickness of 0.23 mm, which was in turn subjected to decarburization annealing and finishing annealing to allow secondary recrystallized grains having the Goss orientation to develop. Thus, a steel sheet having a forsterite coating was obtained.

Subsequently, of the steel sheet having a forsterite coating, the forsterite coating on a steel sheet surface was removed by pickling, whereafter the surface was smoothed by chemical polishing using hydrofluoric acid. Thus, a steel sheet was obtained. The thickness of the steel sheet after the chemical polishing was 0.22 mm.

Coating Layer A: Ceramic Coating

Each of ceramic coatings having the compositions of Nos. 1 to 26 shown in Table 2 below was formed on the steel sheet to have a thickness shown in Table 2 below by a CVD method or a PVD method. The amount of oxide in the ceramic coating was not more than 2 mass % in each sample.

For the CVD method, a thermal CVD method was used, and the coating formation was carried out under conditions of 1050° C. and 1000 Pa. For the PVD method, the ion plating method was used, and the coating formation carried out under conditions of 450° C., 3 Pa and a bias voltage of −20 V.

To examine the influence of the oxide in the ceramic coating that may vary with the amount of the oxide, the ceramic coatings having the compositions of Nos. 27 and 28 shown in Table 2 below were formed to have a thickness shown in Table 2 below. The amount of oxide in the ceramic coating was controlled by adding a trace amount of oxygen, with a varying partial pressure thereof, to the atmosphere used for coating formation by the PVD method.

Coating Layer B: Insulation Tension Coating

Next, a coating chemical solution was applied using an application roll onto the ceramic coating formed on the steel sheet, dried, and then baked in a nitrogen atmosphere at 850° C. for 15 seconds. Thus, an insulation tension coating with a thickness of 2.0 μm was formed.

For the coating chemical solution, the same coating chemical solution as that of No. 20 in Test Example 1 was used.

The formed insulation tension coating had the composition $40P_2O_5\text{-}55SiO_2\text{-}5WO_3$, a binding energy of 1s orbital of oxygen of 544 eV and a tension of 4.5 MPa/μm.

Evaluation

Each of the obtained grain oriented electrical steel sheets was subjected to stress relief annealing in a nitrogen atmosphere at 800° C. for 3 hours and then evaluated for the coating adhesion property and magnetic property after stress relief annealing in the same manner as in Test example 1. The results are shown in Table 2 below.

TABLE 2

| | Coating layer A (Ceramic coating) | | | Evaluation | | |
|---|---|---|---|---|---|---|
| No. | Coating formation method | Composition | Thickness [μm] | Coating adhesion property [mmφ] | Iron loss $W_{17/50}$ [W/kg] | Remarks |
| 1 | CVD | TiN | 0.01 | 20 | 0.79 | IE |
| 2 | CVD | TiN | 0.10 | 5 | 0.75 | IE |
| 3 | CVD | TiN | 0.30 | 3 | 0.62 | IE |
| 4 | CVD | CrN | 0.01 | 15 | 0.79 | IE |
| 5 | CVD | CrN | 0.10 | 5 | 0.75 | IE |
| 6 | CVD | CrN | 0.30 | 3 | 0.65 | IE |
| 7 | PVD | TiN | 0.01 | 15 | 0.77 | IE |
| 8 | PVD | TiN | 0.10 | 3 | 0.71 | IE |
| 9 | PVD | TiN | 0.30 | 3 | 0.62 | IE |
| 10 | PVD | TiAlN | 0.10 | 3 | 0.70 | IE |
| 11 | PVD | TiSiN | 0.10 | 5 | 0.71 | IE |
| 12 | PVD | TiZrN | 0.10 | 5 | 0.72 | IE |
| 13 | PVD | TiMoN | 0.10 | 10 | 0.71 | IE |
| 14 | PVD | TiYN | 0.10 | 5 | 0.72 | IE |
| 15 | PVD | TiNbN | 0.10 | 5 | 0.73 | IE |
| 16 | PVD | TiWN | 0.10 | 10 | 0.72 | IE |
| 17 | PVD | TiC | 0.10 | 15 | 0.76 | IE |
| 18 | PVD | TiCN | 0.10 | 10 | 0.74 | IE |
| 19 | PVD | TiCrN | 0.10 | 3 | 0.69 | IE |

TABLE 2-continued

| | Coating layer A (Ceramic coating) | | | Evaluation | | |
|---|---|---|---|---|---|---|
| No. | Coating formation method | Composition | Thickness [μm] | Coating adhesion property [mmφ] | Iron loss $W_{17/50}$ [W/kg] | Remarks |
| 20 | PVD | AlCrN | 0.10 | 3 | 0.67 | IE |
| 21 | PVD | SiCrN | 0.10 | 5 | 0.71 | IE |
| 22 | PVD | ZrCrN | 0.10 | 10 | 0.73 | IE |
| 23 | PVD | MoCrN | 0.10 | 10 | 0.71 | IE |
| 24 | PVD | YCrN | 0.10 | 5 | 0.70 | IE |
| 25 | PVD | NbCrN | 0.10 | 10 | 0.74 | IE |
| 26 | PVD | WCrN | 0.10 | 10 | 0.73 | IE |
| 27 | PVD | TiSiON (29 mass % of oxide) | 0.30 | 15 | 0.72 | IE |
| 28 | PVD | TiSiON (30 mass % of oxide) | 0.30 | 30 | 0.82 | CE |

IE: Inventive Example
CE: Comparative Example

As can be seen in Table 2 above, with the grain oriented electrical steel sheets of the inventive examples, the no peel-off diameter is less than 30 mm, which means an excellent coating adhesion property, and the iron loss $W_{17/50}$ is less than 0.80, which means an excellent magnetic property.

In Table 2 above, when the inventive examples with the ceramic coatings having a thickness of 0.10 μm are compared, those inventive examples in which the ceramic coatings have either of the compositions TiCrN and AlCrN show further excellent coating adhesion property and magnetic property.

Example 3

Production of Grain Oriented Electrical Steel Sheet

A coating layer A (ceramic coating) and a coating layer B (insulation tension coating) were formed in this order on a steel sheet as described below, thereby obtaining a grain oriented electrical steel sheet.

Steel Sheet

Use was made of an ingot containing, as components in steel, in percentage by mass, C in an amount of 0.05%, Si in an amount of 3.2%, Mn in an amount of 0.05%, Al in an amount of 0.03%, N in an amount of 0.005% and Se in an amount of 0.01%, with the balance being inevitable impurities and Fe.

The ingot was subjected to hot rolling, hot band annealing, and two times of cold rolling with intermediate annealing performed therebetween, to thereby obtain a final cold rolled steel sheet with a thickness of 0.23 mm, which was in turn subjected to decarburization annealing and finishing annealing to allow secondary recrystallized grains having the Goss orientation to develop. Thus, a steel sheet having a forsterite coating was obtained.

Subsequently, of the steel sheet having a forsterite coating, the forsterite coating on a steel sheet surface was removed by pickling, whereafter the surface was smoothed by chemical polishing using hydrofluoric acid. Thus, a steel sheet was obtained. The thickness of the steel sheet after the chemical polishing was 0.20 mm.

Coating Layer A: Ceramic Coating

Next, an AlCrN ceramic coating with a thickness of 0.10 μm was formed on the steel sheet by a PVD method. The amount of oxide in the ceramic coating was not more than 2 mass % in each sample. For the PVD method, the ion plating method was used, and the coating formation was carried out under conditions of 450° C., 3 Pa and a bias voltage of −20 V.

Coating Layer B: Insulation Tension Coating

Next, a coating chemical solution was applied using an application roll onto the ceramic coating formed on the steel sheet, dried, and then baked in a nitrogen atmosphere at 850° C. for 15 seconds. Thus, an insulation tension coating with a thickness shown in Table 3 below was formed.

For the coating chemical solution, the same coating chemical solution as that of No. 20 in Test Example 1 was used.

The formed insulation tension coating had the composition $40P_2O_5$-$55SiO_2$-$5WO_3$, a binding energy of 1s orbital of oxygen of 544 eV and a tension of 4.5 MPa/μm.

EVALUATION

Each of the obtained grain oriented electrical steel sheets was subjected to stress relief annealing in a nitrogen atmosphere at 800° C. for 3 hours and then evaluated for the coating adhesion property and magnetic property after stress relief annealing in the same manner as in Test example 1. The results are shown in Table 3 below.

TABLE 3

| | Coating layer B (Insulation tension coating) | Evaluation | | |
|---|---|---|---|---|
| No. | Thickness [μm] | Coating adhesion property [mmφ] | Iron loss $W_{17/50}$ [W/kg] | Remarks |
| 1 | 1.0 | 3 | 0.74 | IE |
| 2 | 2.0 | 3 | 0.67 | IE |
| 3 | 4.0 | 3 | 0.62 | IE |
| 4 | 6.0 | 3 | 0.60 | IE |
| 5 | 8.0 | 5 | 0.58 | IE |
| 6 | 10.0 | 5 | 0.57 | IE |

IE: Inventive Example

As can be seen in Table 3 above, with the grain oriented electrical steel sheets of the inventive examples, the no peel-off diameter is less than 30 mm, which means an excellent coating adhesion property, and the iron loss $W_{17/50}$ is less than 0.80, which means an excellent magnetic property.

In Table 3 above, comparison between the inventive examples reveals that there is the tendency in which as the insulation tension coating has a larger thickness, the magnetic property is more excellent.

The invention claimed is:

1. A grain oriented electrical steel sheet, comprising:
   a steel sheet;
   a coating layer A comprising a ceramic coating containing an oxide in an amount of less than 30 mass % and disposed on the steel sheet; and
   a coating layer B comprising an insulation tension coating containing an oxide and disposed on the coating layer A,
   wherein a binding energy of is orbital of oxygen in the coating layer B is greater than 530 eV,
   tension applied by the coating layer B to the steel sheet per 1.0 μm thickness of the coating layer B is not less than 4.0 MPa/μm, and
   the oxide of the coating layer B includes Ni, Nb or W.

2. The grain oriented electrical steel sheet according to claim 1, wherein the coating layer A has a thickness of not less than 0.01 μm and not more than 0.30 μm.

3. The grain oriented electrical steel sheet according to claim 1, wherein the coating layer B has a thickness of not less than 1.0 μm and not more than 10.0 μm.

4. The grain oriented electrical steel sheet according to claim 1,
   wherein, in the coating layer B,
   $P_2O_5$ is contained in an amount of 25 to 55 mass %,
   $SiO_2$ is contained in an amount of 42 to 58 mass %, and
   an oxide of an atom having an electronegativity higher than 1.5 other than P and Si is contained in an amount of 2 to 18 mass %.

5. The grain oriented electrical steel sheet according to claim 1, wherein the coating layer A contains a nitride or a carbonitride.

6. The grain oriented electrical steel sheet according to claim 2, wherein the coating layer B has a thickness of not less than 1.0 μm and not more than 10.0 μm.

7. The grain oriented electrical steel sheet according to claim 2,
   wherein, in the coating layer B,
   $P_2O_5$ is contained in an amount of 25 to 55 mass %,
   $SiO_2$ is contained in an amount of 42 to 58 mass %, and
   an oxide of an atom having an electronegativity higher than 1.5 other than P and Si is contained in an amount of 2 to 18 mass %.

8. The grain oriented electrical steel sheet according to claim 3,
   wherein, in the coating layer B,
   $P_2O_5$ is contained in an amount of 25 to 55 mass %,
   $SiO_2$ is contained in an amount of 42 to 58 mass %, and
   an oxide of an atom having an electronegativity higher than 1.5 other than P and Si is contained in an amount of 2 to 18 mass %.

9. The grain oriented electrical steel sheet according to claim 6,
   wherein, in the coating layer B,
   $P_2O_5$ is contained in an amount of 25 to 55 mass %,
   $SiO_2$ is contained in an amount of 42 to 58 mass %, and
   an oxide of an atom having an electronegativity higher than 1.5 other than P and Si is contained in an amount of 2 to 18 mass %.

10. The grain oriented electrical steel sheet according to claim 2, wherein the coating layer A contains a nitride or a carbonitride.

11. The grain oriented electrical steel sheet according to claim 3, wherein the coating layer A contains a nitride or a carbonitride.

12. The grain oriented electrical steel sheet according to claim 4, wherein the coating layer A contains a nitride or a carbonitride.

13. The grain oriented electrical steel sheet according to claim 6, wherein the coating layer A contains a nitride or a carbonitride.

14. The grain oriented electrical steel sheet according to claim 7, wherein the coating layer A contains a nitride or a carbonitride.

15. The grain oriented electrical steel sheet according to claim 8, wherein the coating layer A contains a nitride or a carbonitride.

16. The grain oriented electrical steel sheet according to claim 9, wherein the coating layer A contains a nitride or a carbonitride.

17. A method of producing the grain oriented electrical steel sheet according to claim 1, comprising forming the coating layer A by chemical vapor deposition or physical vapor deposition.

18. The method according to claim 17, further comprising forming the coating layer B by applying a coating chemical solution on the coating layer A with an application roll, followed by baking in a nitrogen atmosphere.

* * * * *